United States Patent [19]

Kinney

[11] Patent Number: 4,517,517
[45] Date of Patent: May 14, 1985

[54] NICKEL-CADMIUM BATTERY CONDITIONER AND TESTER APPARATUS

[75] Inventor: Daniel C. Kinney, Springvale, Me.

[73] Assignee: The United States of America as represented by the Secretary of the Air Force, Washington, D.C.

[21] Appl. No.: 431,434

[22] Filed: Sep. 30, 1982

[51] Int. Cl.³ ............................................. G01N 27/46
[52] U.S. Cl. .................................... 324/433; 324/436; 320/48
[58] Field of Search ............... 324/433, 436, 426, 427; 340/636; 320/5, 9, 10, 14, 21, 48

[56] References Cited

U.S. PATENT DOCUMENTS 3,085,165 4/1963 Schaffert et al. .................. 307/273
4,086,524 4/1978 Kremer ................................ 320/48

Primary Examiner—Michael J. Tokar
Assistant Examiner—Kevin D. O'Shea
Attorney, Agent, or Firm—Donald J. Singer; William Stepanishen

[57] ABSTRACT

A battery tester apparatus having a discharge circuit with a visual indicator that the discharge cycle is in progress operating in combination with a comparator to determine when the terminal voltage of the battery is reached. At this point the comparator provides a signal to an oscillator which in turn controls an SCR diode switch that terminates the discharge cycle.

2 Claims, 1 Drawing Figure

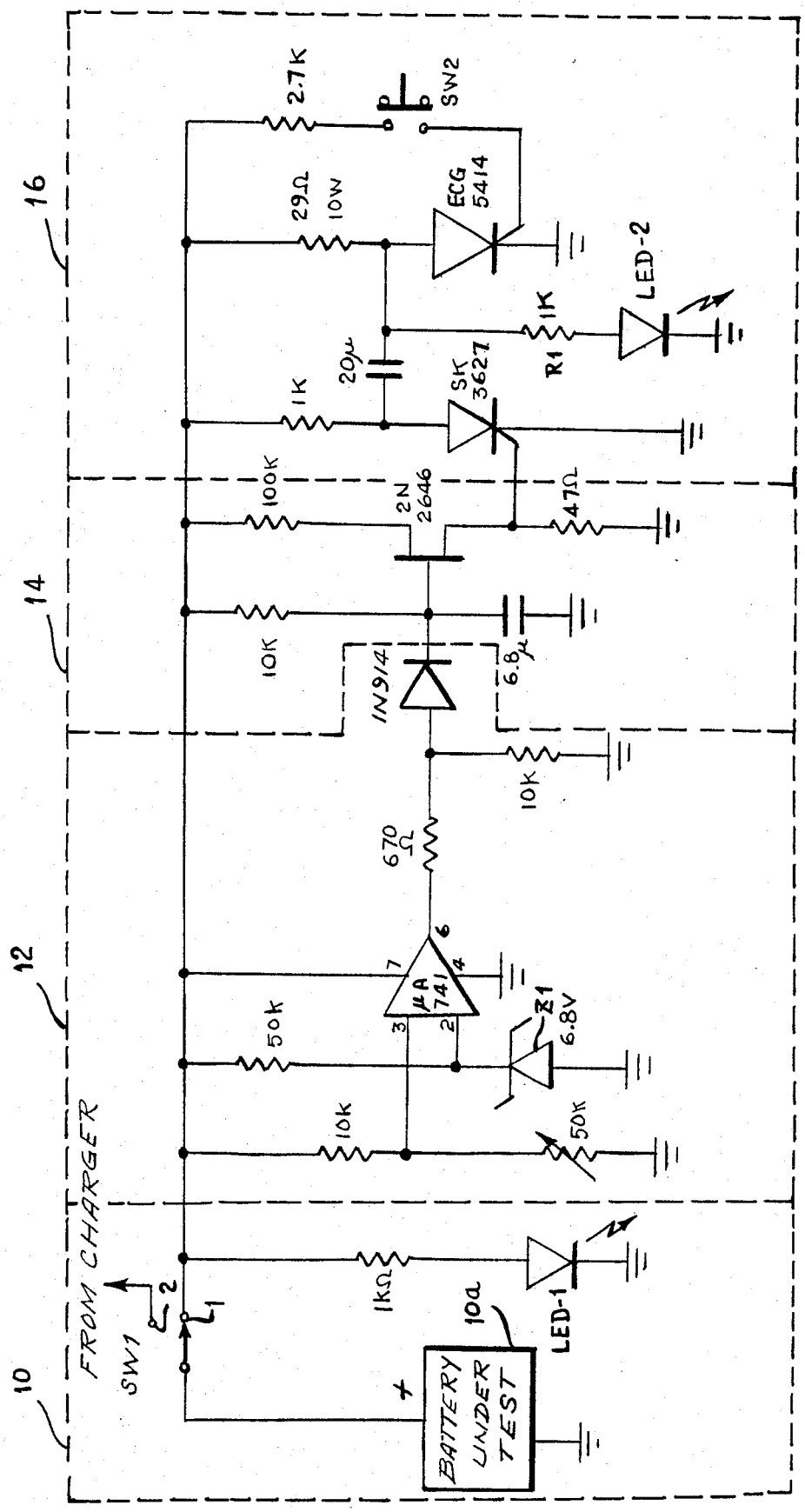

NICKEL-CADMIUM BATTERY CONDITIONER AND TESTER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a battery test apparatus and in particular to a nickel cadmium battery conditioner and tester apparatus.

It is very necessary to know the capacity capabilities of a rechargeable battery in order to determine its condition for use in a particular circuit environment. In other words, if the rate at which a battery loses charge which is in excess of a minimally acceptable rate, the terminal voltage of the battery would fall below the rated voltage in a comparatively short time and thereby render the battery useless or unfit for use in its intended application.

Therefore, it is desirable, and in many instances essential in remotely operated nickel-cadmium battery systems, to determine the state-of-charge of the batteries prior to installation in such systems due to the tendency of the batteries to deteriorate in an unpredictable manner. One prior art system that has been used to determine the battery capacity of nickel-cadmium batteries is the timer-charger system that employs a manual charge-discharge procedure for determining the ampere-hour discharge capacity of the battery. However, such systems generally involve test procedures of relatively long duration, up to 20–30 hours to complete. Moreover, since these systems determine the total ampere-hour capacity at a given discharge rate, these systems obviously have not been suitable as state-of-charge testers.

There have been numerous approaches have been taken to provide a device capable of indicating the state of charge or deterioration of such batteries. These approaches have involved various types of apparatus to provide a test for the conductivity of the electrodes of the battery, since such conductivity changes with cycling and charge.

Additional other techniques and devices for the testing of battery conditions have been devised wherein the specific gravity and/or chemical composition of the battery electrolyte is tested. Such tests are generally complex, inaccurate, and conducive only to a manual rather than an automatic mode of operation.

SUMMARY OF THE INVENTION

The present invention provides a battery test apparatus for determining the state of charge quality of a nickel-cadmium battery. The battery test apparatus provides a battery discharge circuit that discharges the battery under test until a specified terminal voltage level is reached wherein the discharge cycle is automatically terminated. Since a visual indication is provided at the initiation of the discharge cycle and a visual indication is provided at the end of the test cycle, the elapsed time for the discharge test is accurately measured. If the time required to discharge the battery to the predetermined level exceeds a certain value, such as 48 minutes the quality of the battery is acceptable. The battery test apparatus also includes a reconditioning switch for recharging acceptable batteries to full charge capacity.

It is one object of the present invention, therefore, to provide an improved nickel-cadmium battery conditioner and tester apparatus.

It is another object of the present invention to provide an improved nickel-cadmium battery conditioner and tester apparatus to automatically sense the minimum permissable voltage of the battery and then discontinue the discharge mode.

It is another object of the present invention to provide an improved nickel-cadmium battery conditioner and tester apparatus that is simple to operate even to nontechnical personnel.

It is another object of the present invention to provide an improved nickel-cadmium battery conditioner and tester apparatus which does not require continuous monitoring to continuously discharge the battery under test down to a specified voltage.

It is another object of the present invention to provide an improved nickel-cadmium battery conditioner and tester apparatus which provides an indication of completion of the battery discharge test.

These and other advantages, objects and features of the invention will become more apparent after considering the following description taken in conjunction with the illustrative embodiment in the accompanying drawings.

BRIEF DESCRIPTION OF THE DRAWINGS

The sole FIGURE is a schematic diagram of the nickel-cadmium battery conditioner and tester apparatus according to the present invention.

DESCRIPTION OF THE PREFERRED EMBODIMENT

Referring now to the sole FIGURE, there is shown a schematic diagram of the nickel-cadmium battery conditioner and tester apparatus. The schematic diagram has been partitioned into blocks by dashed lines to more clearly present the battery conditioner and tester apparatus in a functional block diagram configuration. The nickel-cadmium battery conditioner and tester apparatus is comprised of the following basic blocks: a unit under test block 10, a comparator block 12, an oscillator block 14, and an SCR switch block 16. The unit under test block 10 comprises the battery under test 10a, a switch SW1; and a test mode indicator which comprises a one kilohm resistor and light emitting diode, LED-1. The comparator block 12 comprises an integrated circuit unit, $\mu$A741, with a reference zener diode Z1 connected to one input and an adjustable voltage divider connected to the other input. Block 14 comprises an unijunction transistor, 2N2646. The SCR switch block 16 comprises a first SCR, SK3627 a discharge load which comprises the 29 ohm resistor and, a second SCR, ECG 5414, a switch, SW2 and a discharge indicator which comprises resistor R1 and light emitting diode, LED-2.

The nickel-cadmium battery conditioner and tester apparatus operates in the following manner.

The nickel-cadmium battery conditioner and tester apparatus is comprised of four basic sections, the unit under test 10, the comparator 12, oscillator 14 and SCR switch unit 16, as described above. The battery to be tested is placed in the battery under test unit 10a with the battery polarities as shown. The battery under test unit 10a may be any suitable and convenient conventional battery holder, which includes electrical connections to the battery. When the battery is placed in its test holder 10a and the switch SW1 is switched to "TEST" mode which is switch position 1, the power is applied to all sections of the circuit. A green light emmitting diode, LED-1, immediately comes on to provide a visual indication that the "TEST" mode has been selected and not "CHARGE" mode which is switch position 2.

When switch SW1 is closed to switch position 1, power is applied from the battery under test to the battery conditioner and tester apparatus, which includes a second light emitting diode, LED-2. The second light emitting diode LED-2 is located in the SCR switch block 16. The second light emitting diode LED-2 goes out as soon as switch SW2 is momentarily depressed. Switch SW2 is utilized to initiate the discharge cycle of the battery under test 10a by activating the discharge load circuit (29 ohm resistor and the second SCR unit, ECG5414) and to turn off the light emitting diode LED-2 to indicate that a discharge load has been placed on the battery.

When the discharge load is applied to the battery, the voltage of the battery under test begins to drop from its maximum or fully charged state to some terminal voltage. The comparator circuit 12 monitors the battery voltage and when the voltage drops to its terminal voltage (approximately 1 volt per cell for a nickel-cadmium battery) the output of the comparator unit $\mu A741$ changes from a high state to a low state. This low output signal from the comparator unit $\mu A741$ to the input of the oscillator unit 16, causes the a unijunction transistor unit 2N2646 to go into oscillation. The sharp output pulses from the unijunction transistor unit 2N2646 are used to turn the SCR switch unit 16 off. The unijunction transistor unit 2N2646 oscillator is utilized in the present circuit to assure that the SCR switch unit 16 would be turned off and thereby stop the discharge cycle of the battery under test. This assurance operates on the fact that the continuous stream of short duration, short rise and fall time, pulses generated by this oscillator. By deep discharging, the state of charge of the battery is tested under operational type conditions and by timing the length of time it takes for a battery under test to change its state of charge condition from its fully charged state to its terminal voltage, is a test of its charge carrying capabilities. While length of time it takes the battery to discharge to its terminal voltage may be manually determined by measuring the time interval between the activation of switch SW2 and the lighting of the second light emitting diode, LED-2, it should be noted that a modification to the circuit could be made such that an in-circuit clock would be initiated when switch SW2 is depressed and turned off after the test is complete.

The circuit operation will be discussed in greater detail with respect to the schematic diagram which is shown in the sole FIGURE. The comparator unit 12 is comprised of the integrated circuit amplifier $\mu A$ 741, the voltage divider which comprises the kilohm resistor in series with a 50 kilohm potentiometer, and a reference voltage circuit comprising a 50 kilohm resistor in series with a 6.8 zener diode, Z1. The 50 kilohm resistor and 6.8 V zener diode Z1 establishes a reference voltage for the $\mu A$ 741 integrated circuit amplifier which is compared with the voltage drop across the 50 kilohm potentiometer in the (10 kilohm resistor and 50 kilohm potentiometer) voltage divider. It should be noted that any zener diode could have been used to generate the reference voltage as long as the 50 kilohm potentiometer were adjusted to establish the battery under test terminal voltage or a voltage proportional therto. The only condition that must be met by this zener diode is that its zener voltage be below the terminal voltage of the battery under test. The 50 kilohm potentiometer is adjusted until the output of the integrated circuit amplifier $\mu A$ 741 switches from a high output to a low output at the terminal voltage, which is specified by the battery under test. Since the integrated circuit amplifier $\mu A$ 741 has no feedback, it is therefore operating at full open loop gain. This theoretical infinity gain state causes the output to be either in full saturation (high output) or cut-off (low output). When the output of the comparator is high, the voltage divider which is comprised of the 670 ohm resistor and 10 kilohm resistor provide a high output to the base of the unijunction transistor unit 2N2646 through the diode, 1n914. When the output of the comparator is low, the diode 1n914 isolates the oscillator unit 14 from the comparator unit 12.

The oscillator section 14 is comprised of the unijunction transistor unit 2N 2646, 6.8 $\mu F$ capacitor, and the 10K, 100, and 47 ohm resistors. The 10 kilohm resistor and 6.8 $\mu F$ capacitor determine the frequency of oscillation of the oscillator unit 14. The values and frequency are not critical. The pulsed output of the oscillator unit 14 goes directly to the gate of the first SCR unit. SK 3627 in the switch section 16. This SCR unit, SK 3627 is used only to short the 20 $\mu F$ capacitor to the ground and thereby momentarily reverse bias to the second SCR unit, ECG 5414. This reverse biasing shuts the second SCR unit, ECG5414 off. It should be noted that, when switch SW2 is depressed and the second SCR unit, ECG 5414 turns on and reverse biases the first SCR unit, SK3627 to shut it off. When the second SCR unit, ECG5414 comes on, it also allows the battery current to pass through the 29 ohm load to ground. This load resistor may be tailored to any specific battery under test that the battery conditioner and tester apparatus the circuit will be utilized to test. The following is a list of resistive loads for some common nickel-cadmium batteries:

65 OHM FOR NLN 6899A, NLN 6682A
32.5 ohm for NLN 6900 A & B, NLN 8232B, NLN 6761A
29 ohm for NLN 4463A or B
53 ohm for NLN 4462A In all cases, the time from initiation to full discharge must exceed 48 minutes or the battery is considered to be defective.

Although the invention has been described with reference to a particular embodiment, it will be understood to those skilled in the art that the invention is capable of a variety of alternative embodiments within the spirit and scope of the appended claims.

What is claimed is:

1. A nickel-cadmium battery conditioner and test apparatus comprising in combination:
    a battery under test means to receive a battery,
    a means for comparing voltage connected to said battery, said comparing means comparing the terminal voltage of said battery with a reference voltage, said comparing means providing a high output signal when said terminal voltage is high than said reference voltage, said comparing means providing a low output signal when said terminal voltage is lower than said reference voltage,
    a means for oscillating connected to said comparing means to receive an output signal therefrom. said oscillating means operating in a quiescent state when said high output signal is received from said comparing means, said oscillating means going into oscillation when said low output signal is received from said comparing means, said oscillating means providing a pulsed output signal; and a switching means connected to said oscillating means, said switching means including a first switch to initiate the discharge cycle of said battery through a discharge circuit, said switching means including a visual indicator means to indicate that said discharge cycle is in progress, said switching means receiving said pulsed output signal from said oscillating means when the terminal voltage of said battery is reached, said switching means terminating said discharge cycle and providing an indication that said terminal voltage has been reached, said switching means comprise a first and second SCR diode, said first SCR diode receiving the pulsed output signal from said oscillating means at its input gate, said second SCR diode in series with a resistor forms said discharge circuit, one end of said resistor is connected directly to said battery, the other end of said resistor being connected to the anode of said second SCR diode, the cathode of said second SCR diode being connected to ground, the gate of said second SCR diode being connected to said first switch, the anode of said first SCR diode being connected to said second SCR diode anode by a capacitor, said first SCR diode responding to said pulsed output signal by turning said second SCR diode off thereby terminating the discharge cycle of said battery.

2. A nickel-cadmium battery conditioner and test apparatus as described in claim 1 wherein said visual indicator means comprises a second light emitting diode.

* * * * *